United States Patent
Umemoto et al.

(10) Patent No.: US 7,144,833 B2
(45) Date of Patent: Dec. 5, 2006

(54) DIELECTRIC CERAMIC COMPOSITION AND LAMINATED CERAMIC DEVICE USING THE SAME

(75) Inventors: Takashi Umemoto, Hirakata (JP); Hiroshi Nonoue, Hirakata (JP); Toshio Tanuma, Toyonaka (JP); Kenichiro Wakisaka, Ueno (JP)

(73) Assignee: Sanyo Electric Co., Ltd., Osaka (JP)

(*) Notice: Subject to any disclaimer, the term of this patent is extended or adjusted under 35 U.S.C. 154(b) by 0 days.

(21) Appl. No.: 10/951,879

(22) Filed: Sep. 29, 2004

(65) Prior Publication Data

US 2005/0074590 A1    Apr. 7, 2005

(30) Foreign Application Priority Data

Sep. 29, 2003 (JP) ............... 2003-337023
Feb. 27, 2004 (JP) ............... 2004-052900
Aug. 30, 2004 (JP) ............... 2004-249419

(51) Int. Cl.
  *C03C 3/062* (2006.01)
  *B32B 15/00* (2006.01)
(52) U.S. Cl. ............... 501/32; 501/5; 428/210
(58) Field of Classification Search ............... 501/5, 501/32; 428/210
  See application file for complete search history.

(56) References Cited

U.S. PATENT DOCUMENTS

| 5,188,886 A | * | 2/1993 | Dupon et al. ............... 428/209 |
| 5,378,662 A | * | 1/1995 | Tsuyuki ............... 501/17 |
| 5,783,507 A | * | 7/1998 | Sakoske ............... 501/17 |
| 6,444,598 B1 | | 9/2002 | Kawakami et al. |

FOREIGN PATENT DOCUMENTS

| JP | 10-022162 | 1/1998 |
| JP | 2001-84835 A | 3/2001 |
| JP | 2003-238249 A | 8/2003 |

* cited by examiner

*Primary Examiner*—Cathy F. Lam
(74) *Attorney, Agent, or Firm*—McDermott Will & Emery LLP

(57) ABSTRACT

A dielectric ceramic composition containing crystalline glass, amorphous glass and a ceramic filler, characterized in that a softening point of said crystalline glass is higher than a softening point of said amorphous glass and is 900° C. or lower, and 27% by weight or higher of the crystalline glass and less than 20% by weight of the amorphous glass are contained in the ceramic composition and the total content of the crystalline glass and the amorphous glass is 60% by weight or lower, and 40% by weight or higher of the ceramic filler is contained in the ceramic composition.

8 Claims, 2 Drawing Sheets

DIELECTRIC CERAMIC COMPOSITION AND LAMINATED CERAMIC DEVICE USING THE SAME

The priority Japanese Patent Application Numbers 2003-337023, 2004-52900 and 2004-249419 upon which this patent application is based is hereby incorporated by reference.

BACKGROUND OF THE INVENTION

1. Field of the Invention

The present invention relates to a dielectric ceramic composition used in laminated ceramic devices and a laminated ceramic device using the same.

2. Description of the Related Art

In recent years, needs for laminated ceramic devices have rapidly grown as electronic components of miniature size or low-profile come into wide use. As a typical example of laminated ceramic devices, there can be given a device in which a circuit of inductors or capacitors is constructed on respective layers using a Low Temperature Cofired Ceramics (LTCC) which can be co-fired with a conductive material such as Ag or the like. As the Low Temperature Cofired Ceramics used in the laminated ceramic devices, a dielectric ceramic composition, being a mixture of a filler of ceramic such as alumina and glass, is generally used.

Though it becomes necessary to blend glass in an amount of more than about 60% by weight in order to enhance a sintering property at temperature of the order of 900° C., a problem of an increase in a material cost arises when a quantity of glass to be added is increased. And, when the quantity of glass to be added is small, there is a problem that an adequate sintering property cannot be attained and a mechanical strength and a dielectric property deteriorate.

SUMMARY OF THE INVENTION

It is an object of the present invention to provide a dielectric ceramic composition which has a high mechanical strength and an excellent dielectric property and can be sintered at low temperature of the order of 900° C.

The present invention pertains to a dielectric ceramic composition containing crystalline glass (i.e., crystallizable glass), amorphous glass and a ceramic filler, and is characterized in that a softening point of the crystalline glass is higher than a softening point of the amorphous glass and is 900° C. or lower, and 27% by weight or higher of the crystalline glass and less than 20% by weight of the amorphous glass are contained in the ceramic composition and the total content of the crystalline glass and the amorphous glass is 60% by weight or lower, and 40% by weight or higher of the ceramic filler is contained in the ceramic composition.

In accordance with the present invention, it is possible to form a dielectric ceramic composition which has a high mechanical strength and an excellent dielectric property and can be sintered at low temperature of the order of 900° C.

In the present invention, the softening point of the crystalline glass is higher than that of the amorphous glass and is 900° C. or lower. Therefore, in a firing step, since the amorphous glass softens before the crystalline glass crystallizes and this provides fluidity for the ceramic composition, a rearrangement of a crystalline glass particle and a ceramic filler particle is promoted and then softening and crystallization of the crystalline glass occurs. Therefore, it becomes possible to sinter at low temperature of the order of 900° C. even in the case of a small content of the glass ingredient. Accordingly, the cost can be reduced and also a dielectric ceramic substrate which has a high mechanical strength and an excellent dielectric property can be formed.

FIG. 1 is a view in schematic form for illustrating the above-mentioned actions and effects of the present invention. In the dielectric ceramic composition of the present invention, in its firing step, the amorphous glass 2 softens first as shown in FIG. 1(a) and this provides fluidity for the ceramic composition. Thereby, a rearrangement of a particle of the crystalline glass 1 and a particle of the ceramic filler 3 is promoted. When in this state, a temperature of the ceramic composition further approaches a firing temperature, the crystalline glass 1 softens and the crystallization of the crystalline glass 1 occurs to deposit a crystalline phase 4 from the crystalline glass as shown in FIG. 1(b). Therefore, it is possible to form the dielectric ceramic which has a high mechanical strength and an excellent dielectric property.

In Japanese Unexamined Patent Publications No. 2001-84835, there is disclosed an insulating composition containing a crystalline glass composition, an amorphous glass composition and a ceramic composition, but this is an insulating composition in which the ratio between the crystalline glass and the amorphous glass to be blended is adjusted in order to control a coefficient of thermal expansion after sintering and softening points of the crystalline glass and the amorphous glass are not disclosed. And, it is described that it is not possible to sinter at low temperature when the insulating composition contains 50% by weight or higher a $SiO_2$ filler.

In Japanese Unexamined Patent Publications No. 10-22162, there is disclosed a composite laminated ceramic device containing crystalline glass in which a high dielectric constant layer and a low dielectric constant layer are laminated and the high dielectric constant layer and a conductive layer are bound by fluidization/softening of the low dielectric constant layer in its firing. There is no disclosure of rendering a softening point of the crystalline glass higher than a softening point of the amorphous glass and the content of a ceramic filler is as low as 19% by weight or lower.

In the present invention, 27% by weight or higher of the crystalline glass and less than 20% by weight of the amorphous glass are contained in the ceramic composition. There is a tendency that a mechanical strength and a dielectric property deteriorate when a content of the crystalline glass becomes low. A content of the crystalline glass is preferably 27 to 58% by weight and more preferably 30 to 55% by weight. A content of the amorphous glass is preferably 2 to 18% by weight.

Also in the present invention, the total content of the crystalline glass and the amorphous glass is 60% by weight or lower, and 40% by weight or higher of the ceramic filler is contained in the ceramic composition. There is a tendency that a mechanical strength and a dielectric property deteriorate when a content of the ceramic filler becomes lower than 40% by weight.

As the ceramic filler used in the present invention, a substance consisting of a material having a dielectric constant of 5 or more is preferably used. As such a material, there can be given $Al_2O_3$ (alumina), $TiO_2$ (titania), $Al_6Si_2O_{13}$ (mullite), $ZrO_2$, $CaZrO_3$, $ZnNb_2O_6$-based compounds, $SrTiO_3$-based compounds, $BaTiO_3$-based compounds, $BaO.R_2O_3.TiO_2$-base (R: rare earth elements), $NaO.R_2O_3.TiO_2$-base (R: rare earth elements), $CaO.R_2O_3.TiO_2$-base (R: rare earth elements), $Li_2O.R_2O_3.TiO_2$-base (R: rare earth elements), and $CaTiO_3.R_{2/3}TiO_3(LiR)TiO_3$-base (R: rare earth elements).

As the crystalline glass used in the present invention, there can be preferably used a substance in which a diopside phase is deposited as a main phase after firing. As such a substance, there is given crystalline glass with a composition of $SiO_2$ (45 to 60% by weight)-MgO (10 to 30% by weight)-CaO (15 to 35% by weight). And, as another crystalline glass, there is given the following.

anorthite based on $CaO.Al_2O_3.SiO_2$ ($CaO.Al_2O_3.SiO_2$ is deposited after firing)

Sr-feldspar based on $SrO.Al_2O_3.SiO_2$ ($SrO.Al_2O_3.2SiO_2$ is deposited after firing)

Ba-feldspar based on $BaO.Al_2O_3.SiO_2$ ($BaO.Al_2O_3.2SiO_2$ is deposited after firing)

lanthanoid titanate based on $TiO_2.Ln_2O_3$ ($TiO_2.Ln_2O_3$ is deposited after firing).

As the amorphous glass used in the present invention, there is given, for example, the following.

a substance based on $SiO_2 \cdot B_2O_3$, to which $Na_2O$ is added in an amount of 0.1 to 5 parts by weight per 100 parts by weight of $SiO_2$ a substance based on $SiO_2 \cdot B_2O_3$, to which $ZrO_2$ is added in an amount of 0.5 to 10 parts by weight per 100 parts by weight of $SiO_2$ and $Na_2O$ is added in an amount of 0.1 to 5 parts by weight per 100 parts by weight of $SiO_2$ a substance based on $SiO_2 \cdot B_2O_3$, to which CaO is added in an amount of 10 to 25 parts by weight per 100 parts by weight of $SiO_2$ a substance with a composition of $SiO_2$ (75 to 85% by weight)-$B_2O_3$ (15 to 25% by weight)-$Al_2O_3$ (0.1 to 5% by weight)

a substance with a composition of $SiO_2$ (40 to 50% by weight)-$B_2O_3$ (20 to 30% by weight)-$Al_2O_3$ (15 to 25% by weight)-CaO (4 to 10% by weight)

a substance with a composition of $SiO_2$ (70 to 85% by weight)-$B_2O_3$ (10 to 25% by weight)-$K_2O$ (0.5 to 5% by weight)-$Al_2O_3$ (0.01 to 1% by weight).

In addition, in the above glass composition, the term expressed as % by weight refers to a percentage of the composition each of which adds up to 100% by weight.

In the present invention, the amorphous glass may contain bismuth (Bi). The content of Bi in the amorphous glass is preferably 30% by weight or higher as $Bi_2O_3$, more preferably 50% by weight or higher.

In the present invention, preferably, the amorphous glass containing bismuth (Bi) further contains boron (B). The content of B in the amorphous glass is preferably 5 to 50% by weight as $B_2O_3$, more preferably 10 to 40% by weight.

In the present invention, the content of Bi in the dielectric ceramic composition is preferably 2% by weight or higher, and the content of B in the dielectric ceramic composition is preferably 0.1 to 3% by weight.

In the present invention, the softening points of the crystalline glass and the amorphous glass can be measured by a differential thermal analysis (DTA).

A laminated ceramic device of the present invention is characterized by being obtained by firing a dielectric green sheet composed of a dielectric layer consisting of the above-mentioned dielectric ceramic composition of the present invention and a conductive layer formed on the surface of the dielectric layer.

In the laminated ceramic device of the present invention, it is preferred that all dielectric layers composing the laminated ceramic device is obtained by firing the dielectric green sheet consisting of the above-mentioned dielectric ceramic composition of the present invention.

FIG. 2 is a perspective view showing the laminated ceramic device of the present invention, and FIG. 3 is an exploded perspective view thereof. As shown in FIGS. 2 and 3, the conductive layer 12 is formed on the surface of the dielectric layer 11. And, there is also a dielectric layer provided with via holes 13 among the dielectric layers 11. By laminating a plurality of such the dielectric layers, the laminated ceramic device is constituted.

As a specific example of the laminated ceramic device of the present invention, there are given high-frequency modules such as an LC filter, an antenna switch module, a front-end module and the like, a light superimposed module, substrates for a semiconductor, substrates for a quartz oscillator, packages for a chip LED and packages for a SAW device.

In accordance with the present invention, it is possible to form the dielectric ceramic composition which has a high mechanical strength and an excellent dielectric property and can be sintered at low temperature of the order of 900° C.

DESCRIPTION OF THE PREFERRED EMBODIMENTS

Figure 1:
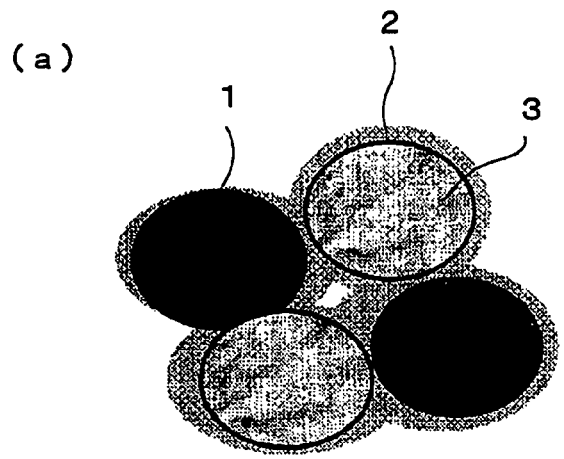
FIG. 1 is a schematic view showing a state of a dielectric ceramic composition of the present invention in a firing step.
Figure 1:
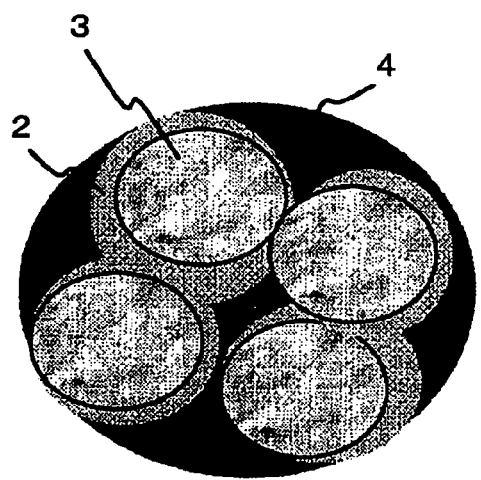

Hereinafter, the present invention will be described in detail by way of examples, but the present invention is not limited to the following examples and can be appropriately modified to embody as long as its gist is not modified.

[Preparation of Dielectric Ceramic Composition]

As crystalline glass, the following glasses (A) and (B) were used.

(A) Crystalline glass based on $SiO_2$ (56 parts by weight)-MgO (18 parts by weight)-CaO (26 parts by weight), which has a softening point of 800° C., a crystallization point of 850° C., an average particle diameter of 2.6 μm and a coefficient of thermal expansion of 7.9 ppm/K (B) Crystalline glass, which is cordierite glass, based on $MgO.Al_2O_3.SiO_2$ and depositing $2MgO.2Al_2O_3.5SiO_2$ (cordierite phase) after firing, and has a softening point of 950° C., a crystallization point of 1050° C., an average particle diameter of 2.7 μm and a coefficient of thermal expansion of 9.0 ppm/K.

As amorphous glass, the following glasses (C)–(E) were used.

(C) Amorphous glass, which is a substance, to which $Na_2O$ is added in an amount of 1 part by weight per 100 parts by weight of $SiO_2$, based on $SiO_2 \cdot B_2O_3$, and has a softening point of 566° C., an average particle diameter of 2.7 μm and a coefficient of thermal expansion of 8.5 ppm/K (D) Amorphous glass, which is a substance, to which $ZrO_2$ is added in an amount of 5 parts by weight per 100 parts by weight of $SiO_2$ and $Na_2O$ is added in an amount of 1 part by weight per 100 parts by weight of $SiO_2$, based on $SiO_2 \cdot B_2O_3$, and has a softening point of 750° C., an average particle diameter of 3.4 μm and a coefficient of thermal expansion of 6.3 ppm/K (E) Amorphous glass, which is a substance, to which CaO is added in an amount of 20 parts by weight per 100 parts by weight of $SiO_2$, based on $SiO_2 \cdot B_2O_3$, and has a softening point of 870° C., an average particle diameter of 2.4 μm and a coefficient of thermal expansion of 3.7 ppm/K.

A dielectric ceramic composition was prepared by using the above crystalline glass and the above amorphous glass in combination as shown in Tables 1 to 3 and using $Al_2O_3$ (an average particle diameter: 1.3 μm) as a ceramic filler. The respective compounds were mixed so as to be 40% by weight crystalline glass, 10% by weight amorphous glass and 50% by weight ceramic filler as a compound ratio, and to 100 parts by weight of this mixed powder, 50 parts by weight of isopropanol (IPA) was added, and the resulting mixture was subjected to wet blending for 60 hours in a ball mill using a zirconia pot and ball.

Next, the mixture was dried, and after evaporating a solvent component, a polyvinyl butyral (PVB)-based binder was added and the resulting mixture was further mixed for 24 hours with a ball mill to form slurry.

Green sheets with a thickness of 50 μm were formed from the obtained slurry with a doctor blade device. These sheets were cut into a predetermined size and the respective sheets were laminated into eight layers, and then the laminated sheets was maintained at 900° C. for 2 hours to be fired. Incidentally, in this firing step, debinding was conducted at 400° C.

As a crystal structure of the fired sample was identified by X-ray diffraction, in the samples in which the crystalline glass (A) was used, a peak of an alumina phase resulting from the ceramic filler and a peak of an diopside phase resulting from the crystalline glass were recognized as a main phase.

With respect to each sample, the flexural strength, the relative density and the dielectric loss were measured. The flexural strength was evaluated with a three point bend tester (a span is 20 mm) with the sample machined in the form of strap of 5 mm in width and 30 mm in length. The relative density was derived by dividing a bulk density by a theoretical density. The dielectric loss was determined from impedance values from 1 MHz to 1.8 GHz using an impedance analyzer. The results of measurements are shown in Tables 1 to 3. Incidentally, in Tables 1 to 3, the range of the present invention represents the fields enclosed with a thick line box.

TABLE 1

| Flexural Strength (MPa) | Softening Point of Amorphous Glass (° C.) | | |
|---|---|---|---|
| | 566 | 750 | 870 |
| Softening Point of Crystalline Glass (800° C.) | 280 | 310 | 136 |
| Softening Point of Crystalline Glass (950° C.) | 115 | 112 | 102 |

TABLE 2

| Relative Density (%) | Softening Point of Amorphous Glass (° C.) | | |
|---|---|---|---|
| | 566 | 750 | 870 |
| Softening Point of Crystalline Glass (800° C.) | 94 | 95 | 70 |
| Softening Point of Crystalline Glass (950° C.) | 61 | 56 | 65 |

TABLE 3

| tan δ (@ 1.8 GHz) (Dielectric Loss) | Softening Point of Amorphous Glass (° C.) | | |
|---|---|---|---|
| | 566 | 750 | 870 |
| Softening Point of Crystalline Glass (800° C.) | <0.01 | <0.01 | 0.05 |
| Softening Point of Crystalline Glass (950° C.) | 0.03 | 0.06 | 0.05 |

When the crystalline glass and the amorphous glass are combined so as to lie within the range of the present invention as shown in Tables 1 to 3, high flexural strength and a high relative density has been attained. Also, a dielectric loss was reduced. It is considered as a reason for this that since softening/fluidization of the amorphous glass at about a softening point of the amorphous glass causes a rearrangement of the crystalline glass particle and the ceramic filler particle to occur and softening and crystallization of the crystalline glass occur after this rearrangement, a formation of a closely packed structure was promoted as a whole.

It was verified that when the softening point of the crystalline glass exceeds 900° C., sintering becomes insufficient and adequate density cannot be attained after sintering, and therefore the strength is reduced and the dielectric loss increases.

And, excellent properties cannot be attained also when the softening point of the crystalline glass is lower than that of the amorphous glass. It is assumed as a reason for this that a crystal nucleus of the crystalline glass was generated before the amorphous glass softened and therefore a sufficient effect of the rearrangement of particles by softening/fluidization of the amorphous glass could not be obtained.

Next, in the combination of the crystalline glass (A) (softening point: 800° C.) and the amorphous glass (D) (softening point: 750° C.), which exhibited the excellent results in the above tests, the evaluations were conducted by changing the ratio of the compounds to be mixed. Test samples were prepared in the sane manner as in the above tests and the flexural strength, the relative density and the dielectric loss were evaluated in the same manner as in the above tests. The results of the evaluation are shown in Tables 4 to 6.

Incidentally, in Tables 4 to 6, the fields enclosed with a thick line box represent the range of the present invention.

TABLE 4

| Flexural Strength (MPa) | | Quantity of Amorphous Glass to be Added (% by weight) | | | | |
|---|---|---|---|---|---|---|
| | | 0 | 5 | 10 | 15 | 20 |
| Crystalline Glass | Crystalline Glass 25% by weight | 56 | 138 | 140 | 145 | 121 |
| | Crystalline Glass 30% by weight | 71 | 250 | 253 | 255 | 133 |
| | Crystalline Glass 40% by weight | 122 | 302 | 310 | 295 | 145 |
| | Crystalline Glass 50% by weight | 131 | 305 | 293 | 144 | 131 |

TABLE 5

| Relative Density (%) | | Quantity of Amorphous Glass to be Added (% by weight) | | | | |
|---|---|---|---|---|---|---|
| | | 0 | 5 | 10 | 15 | 20 |
| Crystalline Glass | Crystalline Glass 25% by weight | 51 | 65 | 73 | 84 | 83 |
| | Crystalline Glass 30% by weight | 55 | 85 | 87 | 93 | 91 |
| | Crystalline Glass 40% by weight | 62 | 85 | 95 | 96 | 95 |
| | Crystalline Glass 50% by weight | 71 | 87 | 96 | 95 | 95 |

TABLE 6

| tan δ (@ 1.8 GHz) (Dielectric Loss) | Quantity of Amorphous Glass to be Added (% by weight) | | | | |
|---|---|---|---|---|---|
| | 0 | 5 | 10 | 15 | 20 |
| Crystalline Glass 25% by weight | 0.04 | 0.04 | 0.06 | 0.06 | 0.06 |
| Crystalline Glass 30% by weight | 0.02 | <0.01 | <0.01 | <0.01 | 0.08 |
| Crystalline Glass 40% by weight | <0.01 | <0.01 | <0.01 | <0.01 | 0.08 |
| Crystalline Glass 50% by weight | <0.01 | <0.01 | <0.01 | 0.07 | 0.09 |

As is apparent from Tables 4 to 6, it is understood that the density after firing becomes relatively high but the dielectric loss resulting from the ingredient of the amorphous glass increases when the content of the amorphous glass is 20% by weight. Also when the content of the crystalline glass is less than 30% by weight, the dielectric loss increases.

When the amorphous glass is not contained at all, the relative density is reduced and therefore the flexural strength becomes low.

And, when the total content of the crystalline glass and the amorphous glass exceeds 60% by weight, there is an increase in a dielectric loss. It is conceivable that an increase in a glass ingredient, which has a larger dielectric loss than the ceramic filler, causes this result.

Next, there will be shown an example using the amorphous glass containing Bi. The above crystalline glass (A) was used for preparation of the dielectric ceramic composition, and as the amorphous glass, the following glasses (F) to (H) were used.

(F) Amorphous glass based on $Bi_2O_3$ (55 parts by weight)-$B_2O_3$ (35 parts by weight)-ZnO (10 parts by weight), which has a softening point of 518° C. and an average particle diameter of 3.3 μm (G) Amorphous glass based on $Bi_2O_3$ (75 parts by weight)-$B_2O_3$ (15 parts by weight)-ZnO (10 parts by weight), which has a softening point of 469° C. and an average particle diameter of 2.9 μm (H) Amorphous glass based on $Bi_2O_3$ (60 parts by weight)-$B_2O_3$ (25 parts by weight)-ZnO (5 parts by weight)-$SiO_2$ (2 parts by weight), which has a softening point of 536° C. and an average particle diameter of 2.6 μm.

The above crystalline glass (A), one species of the above amorphous glasses (F) to (H) and $Al_2O_3$ (an average particle diameter: 2.6 μm) as a ceramic filler were prepared by weighing the quantities in such a way that the contents of the amorphous glass are 2% by weight, 5% by weight and 10% by weight as shown in Tables 7 to 9, and as for the crystalline glass (A), the total content of the crystalline glass and the amorphous glass is 50% by weight, and the content of the ceramic filler is 50% by weight, and they were mixed. To 100 parts by weight of this mixed powder, 50 parts by weight of isopropanol (IPA) was added, and the resulting mixture was subjected to wet blending for 60 hours using a ball mill consisting of a zirconia pot and ball.

Next, the mixture was dried, and after evaporating a solvent component, a polyvinyl butyral (PVB)-based binder was added and the resulting mixture was further mixed for 24 hours with a ball mill to form slurry.

Green sheets with a thickness of 50 μm were formed from the obtained slurry with a doctor blade device. These sheets were cut into a predetermined size and the respective sheets were laminated into eight layers, and then the laminated sheets was maintained at 900° C. for 2 hours to be fired. Incidentally, in this firing step, debinding was conducted at 400° C.

As a crystal structure of the fired sample was identified by X-ray diffraction, a peak of an alumina phase resulting from the ceramic filler and a peak of an diopside phase resulting from the crystalline glass were recognized as a main phase.

With respect to each sample, the flexural strength, the relative density and the dielectric loss were measured. The flexural strength was evaluated with a three point bend tester (a span is 20 mm) with the sample machined in the form of strap of 5 mm in width and 30 mm in length. The relative density was derived by dividing a bulk density by a theoretical density. The dielectric loss was determined from impedance values from 1 MHz to 1.8 GHz using an impedance analyzer. The results of measurements are shown in Tables 7 to 9. In addition, the amorphous glass (C) in the tables is the amorphous glass (C) not containing Bi, used in the example previously described.

TABLE 7

| Flexural Strength (MPa) | Quantity of Amorphous Glass to be Added (% by weight) | | |
|---|---|---|---|
| | 2 | 5 | 10 |
| Amorphous Glass F | 302 | 310 | 288 |
| Amorphous Glass G | 330 | 300 | 245 |
| Amorphous Glass H | 315 | 318 | 262 |
| Amorphous Glass C | 221 | 303 | 310 |

TABLE 8

| Relative Density (%) | Quantity of Amorphous Glass to be Added (% by weight) | | |
|---|---|---|---|
| | 2 | 5 | 10 |
| Amorphous Glass F | 94 | 95 | 98 |
| Amorphous Glass G | 95 | 98 | 98 |

TABLE 8-continued

| Relative | Quantity of Amorphous Glass to be Added (% by weight) | | |
|---|---|---|---|
| Density (%) | 2 | 5 | 10 |
| Amorphous Glass H | 95 | 98 | 98 |
| Amorphous Glass C | 85 | 87 | 95 |

TABLE 9

| tan δ (×10⁻³) (@ 1.8 GHz) | Quantity of Amorphous Glass to be Added (% by weight) | | |
|---|---|---|---|
| (Dielectric Loss) | 2 | 5 | 10 |
| Amorphous Glass F | <0.01 | <0.01 | <0.01 |
| Amorphous Glass G | <0.01 | <0.01 | <0.01 |
| Amorphous Glass H | <0.01 | <0.01 | <0.01 |
| Amorphous Glass C | <0.01 | <0.01 | <0.01 |

It is understood that in any case of using the amorphous glasses (F) to (H), by adding a quantity of 2 to 10% by weight, the flexural strength and the relative density became high and the dielectric loss was reduced. And, it is found that sufficiently good results were obtained even in the amorphous glass (C) not containing Bi, used in the example previously described, but the relative density is particularly high in the case of using the amorphous glasses (F) to (H) containing Bi.

And, in the amorphous glasses (F) to (H) containing Bi, good results were obtained even when the quantity of the glass added was small, and it is assumed as a reason for this that by containing Bi as an ingredient of the amorphous glass, the viscosity of a liquid phase, which is formed from the amorphous glass in firing, was reduced and therefore a formation of a closely packed structure by sintering the liquid phase was promoted.

[Observation of Reflection Electron Image]

Figure 4:
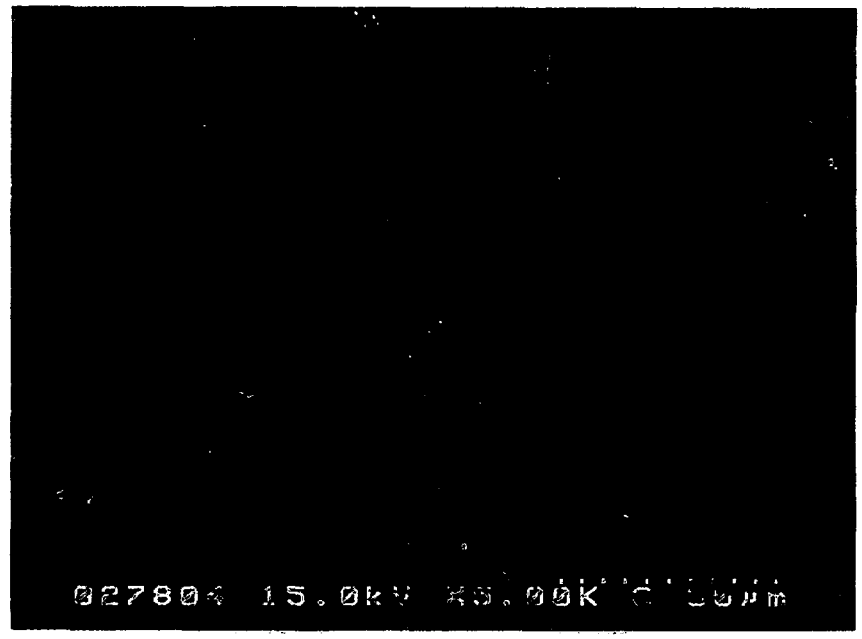
FIG. 4 is a reflection electron image showing a cross section of the fired dielectric ceramic composition of an example of the present invention.

With respect to the above sample containing 10% by weight the amorphous glasses F containing Bi, there was observed a reflection electron image of a cross section of the glass F after firing. The reflection electron image of a cross section of the sample after firing is shown in FIG. 4. It was verified from a selected area diffraction image using a TEM that an area which was found to be relatively white in this reflection electron image has an amorphous structure. And, an element analysis was conducted on this area with EDS (energy dispersion type X-ray detector: beam diameter about 1 nm), and as a result Bi and B were detected.

By thus containing Bi or B in the amorphous glass, it is possible to improve the sintering property and the mechanical strength.

[Preparation of Laminated Ceramic Device]

Figure 2:
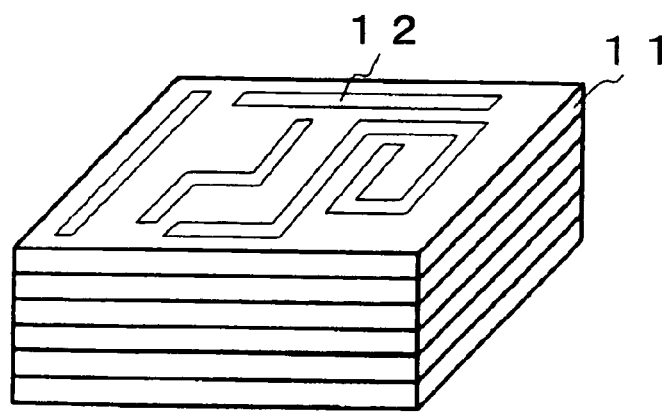
FIG. 2 is a perspective view showing an example of a laminated ceramic device of the present invention.
Figure 3:
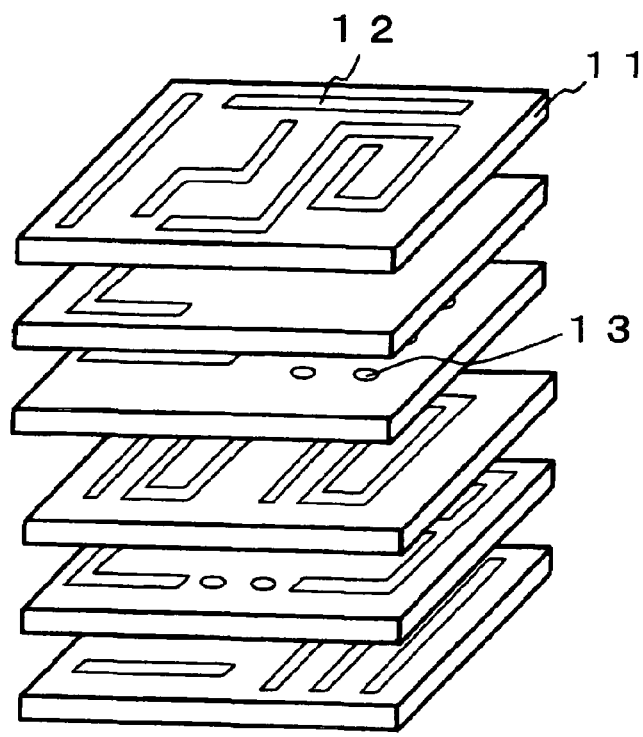
FIG. 3 is an exploded perspective view showing an example of the laminated ceramic device of the present invention.

A chip capacitor, a chip inductor, and a PIN diode were mounted on the laminated ceramic device prepared as shown in FIG. 2 to prepare a high-frequency device. Filter properties were checked, and as a result a degree of suppression in the filter properties was improved and the reduction of an insertion loss was identified. The mechanical strength was also improved.

[Preparation of Printed Wiring Board]

A desired wiring was printed with silver (Ag) paste on the surface of the dielectric layer with a thickness of 50 μm formed using the dielectric ceramic composition of the present invention, and after this printed dielectric layer was laminated into three layers, it was fired to prepare a printed wiring board. Consequently, a printed wiring board having improved mechanical strength could be obtained. A variety of devices, such as a filter, an oscillator or the like, may be mounted on this printed wiring board.

What is claimed is:

1. A dielectric ceramic composition containing 27% by weight or higher of crystalline glass, less than 20% by weight of amorphous glass and 40% by weight or higher of a ceramic filler, and the total content of said crystalline glass and said amorphous glass being 60% by weight or lower,
   wherein said crystalline glass has a softening point of 900° C. or lower which is higher than a softening point of said amorphous glass, and said amorphous glass contains bismuth (Bi), and wherein said dielectric ceramic composition is obtained by sintering the mixed powder of said crystalline glass particles, said amorphous glass particles and said ceramic filler particles.

2. The dielectric ceramic composition according to claim 1, wherein said ceramic filler consists of a material having a dielectric constant of 5 or more.

3. The dielectric ceramic composition according to claim 1 or 2, wherein said crystalline glass deposits a diopside phase as a main phase after firing.

4. The dielectric ceramic composition according to claim 1 wherein said amorphous glass further contains boron (B).

5. The dielectric ceramic composition according to claim 4, wherein an amorphous glass portion exists after firing and the amorphous glass portion contains bismuth (Bi).

6. The dielectric ceramic composition according to claim 5, wherein said amorphous glass portion further contains boron (B).

7. A laminated ceramic device comprising dielectric layers, each dielectric layer being obtained by firing a dielectric green sheet composed of a dielectric layer consisting of the dielectric ceramic composition according to claim 1 and a conductive layer formed on the surface of the dielectric layer.

8. The laminated ceramic device according to claim 7, wherein all said dielectric layers composing the laminated ceramic device are obtained by firing said dielectric green sheet.

* * * * *